(12) United States Patent
Shibata et al.

(10) Patent No.: US 8,035,281 B2
(45) Date of Patent: *Oct. 11, 2011

(54) PHYSICAL QUANTITY DETECTING SENSOR AND ACTUATOR

(75) Inventors: Kenji Shibata, Tsukuba (JP); Fumihito Oka, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/963,222

(22) Filed: Dec. 8, 2010

(65) Prior Publication Data

US 2011/0074251 A1     Mar. 31, 2011

Related U.S. Application Data

(63) Continuation of application No. 12/358,379, filed on Jan. 23, 2009, now Pat. No. 7,884,531.

(30) Foreign Application Priority Data

Jan. 24, 2008   (JP) .................. 2008-013973

(51) Int. Cl.
H01L 41/187     (2006.01)
(52) U.S. Cl. ..................................... 310/358
(58) Field of Classification Search .................. 310/358
See application file for complete search history.

(56) References Cited

U.S. PATENT DOCUMENTS

| | | | |
|---|---|---|---|
| 6,692,652 B2* | 2/2004 | Takao et al. | 252/62.9 R |
| 7,323,806 B2 | 1/2008 | Shibata et al. | |
| 7,470,390 B2* | 12/2008 | Nakamura et al. | 264/672 |
| 7,518,293 B2 | 4/2009 | Shibata et al. | |
| 7,701,121 B2 | 4/2010 | Oka | |
| 7,710,003 B2 | 5/2010 | Shibata et al. | |
| 7,732,996 B2 | 6/2010 | Shibata et al. | |
| 7,884,531 B2* | 2/2011 | Shibata et al. | 310/358 |
| 2004/0214723 A1 | 10/2004 | Nonoyama et al. | |
| 2006/0006360 A1* | 1/2006 | Takao et al. | 252/62.9 R |
| 2007/0176516 A1* | 8/2007 | Nagaya et al. | 310/346 |
| 2009/0075066 A1* | 3/2009 | Shibata et al. | 428/332 |
| 2009/0121374 A1 | 5/2009 | Shibata et al. | |

(Continued)

FOREIGN PATENT DOCUMENTS

JP     2005-203725     7/2005

(Continued)

OTHER PUBLICATIONS

Yoshifumi Nakashima, et al., Lead-Free Piezoelectric (N,Na) NBo3 Thin Films Derived from Metal Alkoxide Precursors, Japanese Journal of Applied, 2007, vol. 46, No. 14, pp. L311-L313.

*Primary Examiner* — Jaydi San Martin
(74) *Attorney, Agent, or Firm* — Antonelli, Terry, Stout & Kraus, LLP.

(57) ABSTRACT

A sensor for detecting a physical quantity includes a piezoelectric thin film device having a lower electrode, a piezoelectric thin film and an upper electrode, and a voltage detecting device connected between the lower and upper electrodes of the piezoelectric thin film device. The piezoelectric thin film is formed of an alkali niobium oxide-based perovskite material expressed by $(K_{1-x}Na_x)NbO_3$ ($0<x<1$), and a (001)$_{KNN}$ plane diffraction peak of the piezoelectric thin film indicates an angle $2\theta$ from 22.1° to 22.5° in an X-ray diffraction $2\theta/\theta$ measurement to a surface of the piezoelectric thin film, and the (001)$_{KNN}$ plane diffraction peak occupies 80% or more of diffraction peaks of the piezoelectric thin film.

16 Claims, 6 Drawing Sheets

U.S. PATENT DOCUMENTS

| | | |
|---|---|---|
| 2009/0236944 A1 | 9/2009 | Shibata et al. |
| 2009/0302715 A1 | 12/2009 | Shibata et al. |
| 2010/0103226 A1* | 4/2010 | Sakashita et al. ............... 347/68 |
| 2010/0141099 A1 | 6/2010 | Suenaga et al. |
| 2010/0156247 A1 | 6/2010 | Shibata et al. |
| 2010/0237745 A1 | 9/2010 | Shibata et al. |

FOREIGN PATENT DOCUMENTS

| | | |
|---|---|---|
| JP | 2009-295786 | 12/2009 |

* cited by examiner

EXAMPLE 2
KNN ON [STRONGLY (111)$_{Pt}$ ORIENTED Pt] / Ti / Si

FIG. 6A

| | | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | EXAMPLE 1 | EXAMPLE 2 | COMPARATIVE EXAMPLE 6 | COMPARATIVE EXAMPLE 7 |
|---|---|---|---|---|---|---|---|---|---|---|
| FORMING CONDITION OF Pt/Ti FILM | Ti ADHESIVE LAYER THICKNESS (nm) | 10 | 5 | 5 | 4 | 2 | 2 | 3 | 10 | 4 |
| | Pt FILM FORMING TEMP. (°C) | 290 | 300 | 300 | 340 | 390 | 400 | 350 | 300 | 290 |
| | Ar/$O_2$ | 95/5 | 98/2 | 95/5 | 96/4 | 100/0 | 99/1 | 98/2 | 95/5 | 99/1 |
| FORMING CONDITION OF KNN FILM | KNN FILM FORMING TEMP. (°C) | 500 | 500 | 500 | 500 | 500 | 500 | 500 | 500 | 500 |
| | Na/(K + Na) COMPOSITION | 0.1 | 0.2 | 0.3 | 0.4 | 0.5 | 0.6 | 0.7 | 0.8 | 0.9 |
| OCCUPATION RATIO OF (001)$_{KNN}$ PLANE (%) | | 50 | 70 | 60 | 80 | 95 | 90 | 81 | 60 | 70 |
| (001)$_{KNN}$ DIFFRACTION PEAK ANGLE (deg.) | | 21.6 | 21.7 | 21.8 | 21.9 | 22.0 | 22.1 | 22.2 | 22.3 | 22.4 |
| $|d_{31}|$ (pm/V) (UNDER 30 kV/cm) | | 32 | 36 | 39 | 40 | 55 | 85 | 83 | 50 | 44 |

FIG. 6B

| | | COMPARATIVE EXAMPLE 8 | COMPARATIVE EXAMPLE 9 | COMPARATIVE EXAMPLE 10 | EXAMPLE 3 | COMPARATIVE EXAMPLE 11 | EXAMPLE 4 | EXAMPLE 5 | COMPARATIVE EXAMPLE 12 | COMPARATIVE EXAMPLE 13 |
|---|---|---|---|---|---|---|---|---|---|---|
| FORMING CONDITION OF Pt/Ti FILM | Ti ADHESIVE LAYER THICKNESS (nm) | 4 | 2 | 2 | 3 | 2 | 5 | 2 | 6 | 3 |
| | Pt FILM FORMING TEMP. (°C) | 310 | 330 | 380 | 380 | 330 | 350 | 400 | 310 | 330 |
| | Ar/O$_2$ | 95/5 | 95/5 | 99/1 | 98/2 | 99/1 | 95/5 | 100/0 | 96/4 | 97/3 |
| FORMING CONDITION OF KNN FILM | KNN FILM FORMING TEMP. (°C) | 550 | 550 | 550 | 550 | 550 | 550 | 550 | 550 | 550 |
| | Na/(K + Na) COMPOSITION | 0.1 | 0.2 | 0.3 | 0.4 | 0.5 | 0.6 | 0.7 | 0.8 | 0.9 |
| OCCUPATION RATIO OF (001)$_{KNN}$ PLANE (%) | | 70 | 75 | 80 | 90 | 78 | 82 | 98 | 65 | 70 |
| (001)$_{KNN}$ DIFFRACTION PEAK ANGLE (deg.) | | 21.8 | 21.9 | 22.0 | 22.1 | 22.2 | 22.3 | 22.4 | 22.5 | 22.6 |
| |d$_{31}$| (pm/V) (UNDER 30 kV/cm) | | 29 | 38 | 55 | 88 | 58 | 84 | 85 | 50 | 37 |

FIG. 6C

| | | COMPARATIVE EXAMPLE 14 | EXAMPLE 6 | COMPARATIVE EXAMPLE 15 | EXAMPLE 7 | COMPARATIVE EXAMPLE 16 | EXAMPLE 8 | COMPARATIVE EXAMPLE 17 | COMPARATIVE EXAMPLE 18 | COMPARATIVE EXAMPLE 19 |
|---|---|---|---|---|---|---|---|---|---|---|
| FORMING CONDITION OF Pt/Ti FILM | Ti ADHESIVE LAYER THICKNESS (nm) | 8 | 1 | 3 | 4 | 5 | 2 | 2 | 2 | 4 |
| | Pt FILM FORMING TEMP. (°C) | 320 | 400 | 330 | 330 | 300 | 410 | 400 | 340 | 310 |
| | $Ar/O_2$ | 96/4 | 100/0 | 98/2 | 97/3 | 96/4 | 100/0 | 99/1 | 97/3 | 99/1 |
| FORMING CONDITION OF KNN FILM | KNN FILM FORMING TEMP. (°C) | 600 | 600 | 600 | 600 | 600 | 600 | 600 | 600 | 600 |
| | Na/(K + Na) COMPOSITION | 0.1 | 0.2 | 0.3 | 0.4 | 0.5 | 0.6 | 0.7 | 0.8 | 0.9 |
| OCCUPATION RATIO OF $(001)_{KNN}$ PLANE (%) | | 63 | 99 | 77 | 83 | 65 | 99 | 90 | 75 | 60 |
| $(001)_{KNN}$ DIFFRACTION PEAK ANGLE (deg.) | | 22.0 | 22.1 | 22.2 | 22.3 | 22.4 | 22.5 | 22.6 | 22.7 | 22.8 |
| $|d_{31}|$ (pm/V) (UNDER 30 kV/cm) | | 50 | 81 | 58 | 85 | 55 | 88 | 51 | 40 | 32 |

PHYSICAL QUANTITY DETECTING SENSOR AND ACTUATOR

CROSS REFERENCE TO RELATED APPLICATION

This application is a continuation of U.S. application Ser. No. 12/358,379, filed Jan. 23, 2009, now U.S. Pat. No. 7,884,531, the contents of which are incorporated herein by reference.

CLAIM OF PRIORITY

The present application claims priority from Japanese patent application serial no. 2008-013973 filed on Jan. 24, 2008, the content of which is hereby incorporated by reference into this application.

BACKGROUND OF THE INVENTION

1. Field of the Invention

The present invention relates to piezoelectric thin film devices using a piezoelectric thin film, more specifically to piezoelectric thin film devices including, on an Si substrate, a piezoelectric thin film of an alkali niobium oxide-based perovskite material.

2. Description of Related Art

Piezoelectric materials are used for piezoelectric devices of various applications. For example, they are widely used for functional electronic components such as actuators in which an applied voltage deforms a piezoelectric element thereby providing an actuation function, and sensors for detecting a physical quantity by utilizing, conversely to actuators, a voltage generated by a deformation of a piezoelectric element. As piezoelectric materials for use in such actuators and sensors, there have been widely used lead-based dielectric materials with excellent piezoelectric properties, in particular perovskite structure ferroelectric materials expressed by the general chemical formula: $Pb(Zr_{1-x}Ti_x)O_3$ (often called PZTs). A PZT is typically made by sintering an oxide of its constituent metals.

In the trend toward downsizing and increasing performance of electronic components, there is also a strong demand for piezoelectric devices with smaller size and higher performance. However, as a piezoelectric material made by widely used conventional sintering methods becomes thinner, the following problem comes to the fore. Specifically, as the thickness of a piezoelectric material approaches the order of 10 μm, it becomes comparable to the grain size of the piezoelectric material; therefore, the influence of the grain boundaries can no longer be ignored. This produces problems such as fluctuation in piezoelectric properties and accelerated device degradation. In order to solve such problems by replacing conventional sintering methods, fabrication methods of piezoelectric materials such as those utilizing thin film formation techniques have been researched in recent years. Therefrom, there have been reported PZT films sputtered on an Si substrate for use in high-sensitivity gyro sensors (angular velocity sensors) (e.g., see JP-A-2005-203725).

On the other hand, PZT piezoelectric sintered bulks and PZT piezoelectric thin films contain approximately 60-70 mass % of lead; so, it is desired to promote research and development of lead-free piezoelectric materials from an environmental consideration. Various lead-free piezoelectric materials are currently being studied, among which is potassium sodium niobate expressed by the general chemical formula: $(K_{1-x}Na_x)NbO_3$ (0<x<1) (hereinafter also referred to as KNN). A KNN has a perovskite structure and exhibits relatively excellent piezoelectric properties among lead-free piezoelectric materials, and is therefore expected to be a promising lead-free piezoelectric material candidate. A KNN $((K_{1-x}Na_x)NbO_3)$ piezoelectric has the highest piezoelectric properties near x=0.5. And, there is a report that a KNN film formed on an Si substrate by CSD (chemical solution deposition) exhibits a piezoelectric constant $d_{33}$ of 46 pm/V (roughly $d_{31}=-d_{33}/2$). (Refer to: Y. Nakashima, W. Sakamoto, H. Maiwa, T. Shimura, and T. Yogo: Jpn. J. Appl. Phys., 46 (2007) L311.)

Such KNN thin films have been attempted to be formed on an Si substrate by other film formation methods besides CSD, such as sputtering and PLD (pulsed laser deposition). However, up to now, KNN thin films on an Si substrate exhibit a relatively low piezoelectric constant $d_{31}$ compared to PZT thin films, and therefore have yet to be applied to high-sensitivity sensors such as gyro sensors.

SUMMARY OF THE INVENTION

Under these circumstances, the present invention addresses the above problems. It is an objective of the present invention to provide a piezoelectric thin film device using a KNN thin film formed on an Si substrate, which has sufficiently high performance to be applied to gyro sensors and the like.

In order to achieve the objective described above, the present invention is configured as described below.

According to one aspect of the present invention, a piezoelectric thin film device comprises a lower electrode, a piezoelectric thin film and an upper electrode, in which the piezoelectric thin film is formed of an alkali niobium oxide-based perovskite material expressed by $(K_{1-x}Na_x)NbO_3$ (0<x<1), and in which a $(001)_{KNN}$ plane diffraction peak of the piezoelectric thin film indicates an angle 2θ from 22.1° to 22.5° in an X-ray diffraction 2θ/θ measurement to a surface of the piezoelectric thin film, and the $(001)_{KNN}$ plane diffraction peak occupies 80% or more of diffraction peaks of the piezoelectric thin film.

In the above aspect of the present invention, the following improvements and modifications can be made.

(i) The absolute value of the piezoelectric constant, $|d_{31}|$, of the piezoelectric thin film is 80 pm/V or more under an applied electric field of 30 kV/cm.

ADVANTAGES OF THE INVENTION

According to the present invention, it is possible to provide a piezoelectric thin film device using a KNN thin film formed on an Si substrate which realizes excellent piezoelectric properties compared to conventional ones and has sufficiently high performance to be applied to gyro sensors and the like.

BRIEF DESCRIPTION OF THE DRAWINGS

FIGS. 6A to 6C are tables showing: forming condition of Pt/Ti film, forming condition of KNN film, occupation ratio of $(001)_{KNN}$ plane, $(001)_{KNN}$ plane diffraction peak angle, and piezoelectric properties of the piezoelectric thin film devices for Examples and Comparative examples.

DETAILED DESCRIPTION OF THE PREFERRED EMBODIMENTS

The present invention is directed to form, on a silicon (Si) substrate, a KNN piezoelectric thin film whose $(001)_{KNN}$ plane diffraction peak angle 2θ falls between 22.1° and 22.5° in an X-ray diffraction 2θ/θ measurement to a surface of the piezoelectric thin film, and whose $(001)_{KNN}$ plane diffraction occupies 80% or more of diffraction peaks of the piezoelectric thin film. By using such a lead-free KNN thin film on an Si substrate having such excellent characteristics, it is possible to provide a piezoelectric thin film device with sufficient properties to be applicable to gyro sensors or the like, which conventional arts have had difficulty in providing. In particular, an important property for gyro sensor applications is the piezoelectric constant $d_{31}$ of the piezoelectric film under relatively low applied electric fields. In this regard, the present invention achieves the $|d_{31}|$ value of 80 pm/V or more under 30 kV/cm, which is a practical level for gyro sensor applications. Thus, with the present invention, there can be realized a gyro sensor sensitivity comparable to that of gyro sensors using a conventional PZT thin film. In addition, the use of an Si substrate enables the piezoelectric thin film device of the present invention to be readily integrated with semiconductor control circuits therefor or other semiconductor circuits or devices on the same substrate.

Herein, an evaluation (measurement) method for a state of a crystal grain alignment of the piezoelectric thin film by X-ray diffraction (XRD) is to be described. In an XRD 2θ/θ measurement, a sample and a detector are scanned by the θ axis, wherein a scanning angle of the sample is θ and that of the detector is 2θ. According to the 2θ/θ measurement, it can be estimated which crystal plane is a predominant plane at a surface of the piezoelectric thin film. And, it can be also estimated change in the lattice constant of the piezoelectric thin film. In the present invention, the change in the lattice constant of the piezoelectric thin film correlates with change in a mixed crystal ratio x of $(K_{1-x}Na_x)NbO_3$ (0<x<1). Furthermore, the X-ray diffraction in the present invention is always conducted by using the Cu—Kα ray.

A preferred embodiment of the present invention will be described in detail with reference to the accompanying drawings. However, the present invention is not limited to the embodiments described herein.

Figure 1:
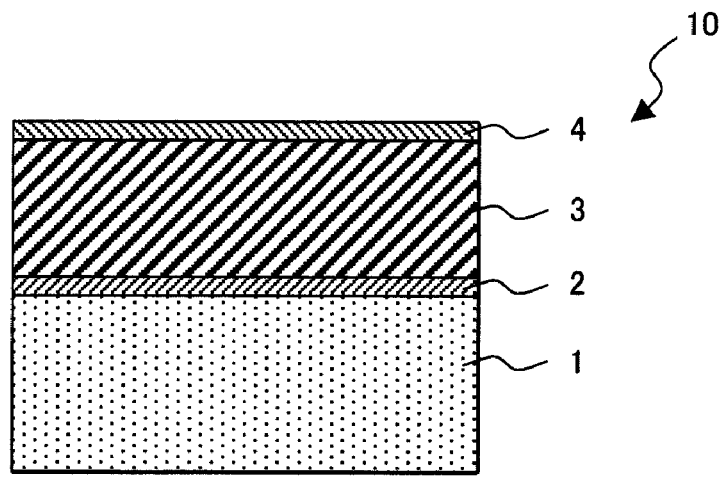
FIG. 1 is a schematic illustration showing a cross-sectional view of a piezoelectric thin film device according to an embodiment of the present invention.

FIG. 1 is a schematic illustration showing a cross sectional view of a piezoelectric thin film device according to an embodiment of the present invention. As shown in FIG. 1, the piezoelectric thin film device 10 of this embodiment is made by sequentially forming, on an Si substrate 1, a lower electrode 2, a KNN piezoelectric thin film 3 and an upper electrode 4.

The Si substrate 1 is an Si single crystalline substrate having a $(100)_{Si}$ oriented surface (hereinafter "(100) Si substrate"). The Si substrate 1 may have an oxide film ($SiO_2$) formed on its surface in order to electrically insulate the lower electrode 2 and Si substrate 1.

The lower electrode 2 serves as an important underlayer for forming the KNN piezoelectric thin film 3 thereon, and therefore it is preferable to employ Pt (platinum) as the electrode material. This is because Pt films formed on the Si substrate 1 are self-oriented preferentially to a $(111)_{Pt}$ plane. In this embodiment, the lower electrode 2 was formed of a Pt thin film grown by RF (radio frequency) magnetron sputtering. In addition, it is more preferable to provide a Ti (titanium) adhesive layer between the Si substrate 1 and lower electrode 2 in order to enhance the adhesiveness of the lower electrode 2 (see Ti adhesive layer 16 in FIG. 5, details are described later).

Unlike the lower electrode 2, the upper electrode 4, which is formed on the KNN piezoelectric thin film 3, does not affect qualities of the piezoelectric film 3. Therefore, there is no particular limitation on the electrode material used. In this embodiment, similarly to the lower electrode 2, the upper electrode 4 was formed of a Pt thin film grown by RF magnetron sputtering.

The KNN piezoelectric thin film 3 is made of an alkali niobium oxide-based perovskite material expressed by the general chemical formula $(K_{1-x}Na_x)NbO_3$ (0<x<1). The KNN piezoelectric thin film 3 can be formed by sputtering, CVD (chemical vapor deposition), PLD, sol-gel process, etc. In this embodiment, the KNN piezoelectric thin film 3 was formed by RF magnetron sputtering. The KNN piezoelectric thin film 3 according to the present invention has a $(001)_{KNN}$ plane diffraction peak indicating an angle 2θ between 22.1° and 22.5° in an X-ray diffraction 2θ/θ measurement to a surface of the piezoelectric thin film, and has occupation ratio of the $(001)_{KNN}$ plane diffraction of 80% or more. The occupation ratio of the $(001)_{KNN}$ plane thereof is preferably 81% or more, and more preferably 82% or more. In addition, to the KNN piezoelectric thin film 3 of this embodiment may be added any one of Ta, Li and Sb, or any combination thereof.

A KNN piezoelectric thin film 3 with the $(001)_{KNN}$ plane occupation ratio of 80% or more can be achieved by, for example, using a highly preferentially $(111)_{Pt}$ plane oriented Pt thin film as the lower electrode 2 underlying the KNN film 3. The highly preferentially $(111)_{Pt}$ plane oriented Pt thin film can be achieved by, for example, making thinner a Ti adhesive layer formed between the Pt thin film and Si substrate, forming the Pt thin film at higher temperatures, or sputtering the Pt thin film in an ambient with lower $O_2$ partial pressure.

A KNN piezoelectric thin film 3 with the $(001)_{KNN}$ plane occupation ratio of 80% or more can be also achieved by interposing an orientation control layer between the Pt lower electrode 2 and KNN piezoelectric film 3. The orientation control layer is for enhancing the $(001)_{KNN}$ plane orientation of the KNN piezoelectric thin film 3 formed on the lower electrode 2. For example, on the Pt surface oriented to the $(111)_{Pt}$ plane is formed an orientation control layer which is more preferentially (001) plane oriented than KNN, thereby causing a KNN film formed thereon to exhibit a stronger $(001)_{KNN}$ orientation than one formed directly on the Pt surface. Specific examples of the orientation control layer include $LaNiO_3$ thin films, $NaNbO_3$ thin films and Na rich $(K_{1-x}Na_x)NbO_3$ thin films having a composition ratio x greater than that of the KNN piezoelectric thin film 3.

On the other hand, an angle 2θ of the $(001)_{KNN}$ plane diffraction peak of the KNN piezoelectric thin film 3 varies depending on several factors such as: the composition ratio x=Na/(K+Na); the magnitude of stress which the KNN film 3 receives from the Si substrate 1; and the conditions of the underlying Pt electrode 2 (e.g., change in the lattice constant in an in-plane direction (a direction parallel to the film surface) of the Pt thin film caused by stress due to thermal expansion coefficient difference between Pt and Si.) In other words, the $(001)_{KNN}$ plane diffraction peak angle $2\theta$ of the KNN piezoelectric thin film 3 can be controlled by means of the composition ratio Na/(K+Na), the film forming temperature, the condition of formation of the underlying Pt lower electrode 2, and other factors.

There will be now described in detail the $(001)_{KNN}$ plane orientation of the KNN piezoelectric thin film 3 as well as the $(001)_{KNN}$ plane diffraction peak angle $2\theta$ in an X-ray diffraction $2\theta/\theta$ measurement.

Figure 2:
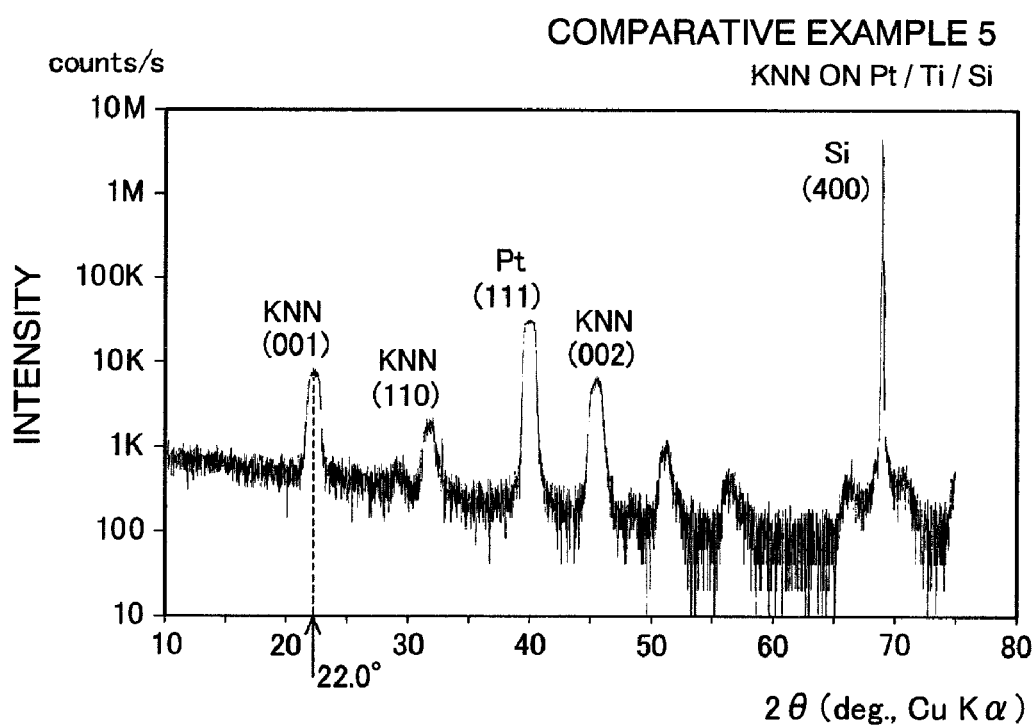
FIG. 2 is an example of a diffraction pattern by an X-ray diffraction 2θ/θ measurement to a surface of the piezoelectric thin film device of a Comparative example.
Figure 3:
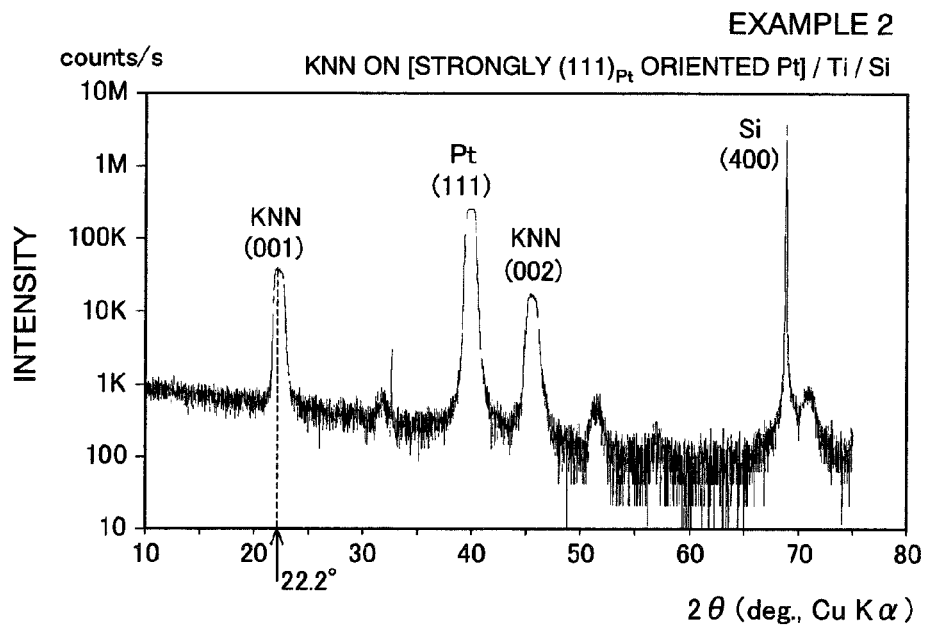
FIG. 3 is an example of a diffraction pattern by an X-ray diffraction 2θ/θ measurement to a surface of the piezoelectric thin film device of an Example.

FIG. 2 is an example of a diffraction pattern by an X-ray diffraction $2\theta/\theta$ measurement to a surface of the piezoelectric thin film device of a Comparative example; and FIG. 3 is an example of a diffraction pattern by the XRD $2\theta/\theta$ measurement to a surface of the piezoelectric thin film device of an Example. FIGS. 2 and 3 respectively show X-ray diffraction patterns obtained for later-described Comparative example 5 (the $(001)_{KNN}$ diffraction peak $2\theta=22.0°$ and Example 2 ($2\theta=22.2°$. The XRD measurement was carried out for piezoelectric thin film devices whose upper electrode had not been formed and whose KNN piezoelectric thin film was therefore exposed.

Herein, on the basis of the JCPDS (International Center for Diffraction Data) for $KNbO_3$ and $NaNbO_3$, and assuming that a KNN thin film on a substrate has a pseudo cubic crystal structure, it can be considered that the X-ray diffraction peak positioned at an angle $2\theta$ between $22.011°$ and $22.890°$ is attributed to a $(001)_{KNN}$ plane. Also herein, occupation ratio of the $(001)_{KNN}$ plane of a KNN piezoelectric thin film is determined using diffraction peaks of KNN positioned at an angle $2\theta$ between $20°$ and $38°$ in an XRD $2\theta/\theta$ measurement. Specifically, the occupation ratio of the $(001)_{KNN}$ plane is defined as below:

Occupation ratio of $(001)_{KNN}$ plane (%)=$[I_{(001)KNN}/\{I_{(001)KNN}+I_{(110)KNN}\}]\times 100$ in which
$I_{(001)KNN}$: diffraction peak intensity of $(001)_{KNN}$ plane;
$I_{(110)KNN}$: diffraction peak intensity of $(110)_{KNN}$ plane.

Besides, diffraction peaks due to the Si substrate and lower electrode are excluded from calculation of the occupation ratio of the KNN thin film. Also, it is in order to ensure the exclusion of diffraction peaks such as $(002)_{KNN}$ plane and $(111)_{Pt}$ plane from the calculation that the diffraction angle $2\theta$ is limited to a range between $20°$ and $38°$.

Referring to FIG. 1 again, a sensor for detecting a physical quantity can be obtained by at least connecting a voltage detecting means between the lower electrode 2 and upper electrode 4. Deformation of the piezoelectric thin film device of this sensor due to a change in some physical quantity will generate a corresponding voltage; thus, various physical quantities can be detected by sensing such voltage. On the other hand, an actuator can be obtained by at least connecting a voltage applying means between the lower electrode 2 and upper electrode 4 in FIG. 1. A voltage application to this sensor will deform the piezoelectric thin film device, thereby enabling actuation of various members. Such sensors include gyro sensors, supersonic sensors, pressure sensors, and velocity/acceleration sensors. And, such an actuator can be used, e.g., in inkjet printers, scanners and supersonic generators.

Figure 4:
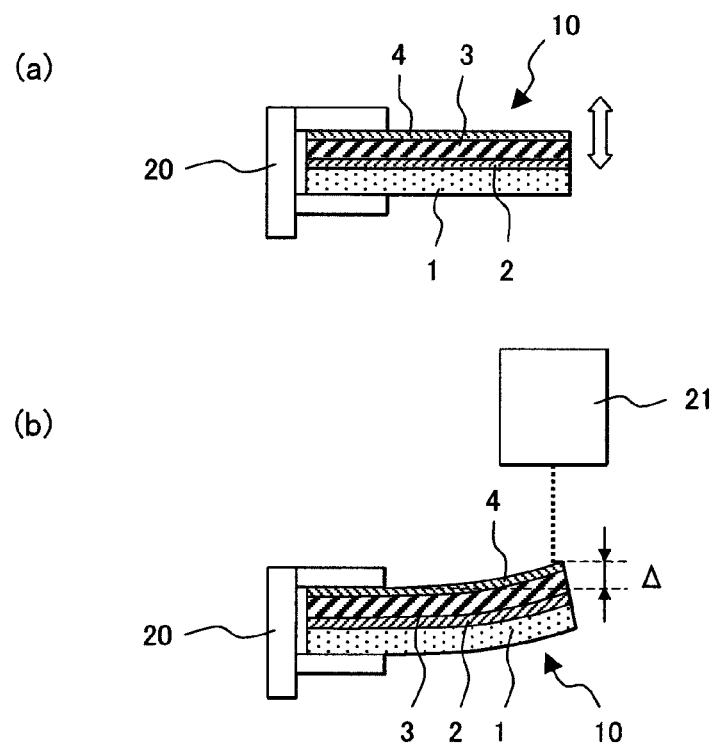
FIGS. 4(a) and 4(b) are schematic illustrations for explaining a measurement method of the piezoelectric constant $d_{31}$ of a piezoelectric thin film device.

The piezoelectric constant $d_{31}$ of the piezoelectric thin film 3 will be now described with reference to FIGS. 4(a) and 4(b). FIGS. 4(a) and 4(b) are schematic illustrations for explaining a measurement method of the piezoelectric constant $d_{31}$ of a piezoelectric thin film device. Firstly, a rectangular strip is cut from the Si substrate 1 in FIG. 1 to fabricate an elongated piezoelectric thin film device 10. Next, one end of the piezoelectric thin film device 10 is clamped with a clamp 20 and the other end is open to configure a simplified unimorph cantilever (FIG. 4(a)). Then, the KNN piezoelectric thin film 3 is stretched or compressed by applying a voltage between the upper electrode 4 and lower electrode 2, thereby causing the entire cantilever (piezoelectric thin film device 10) to bend. And, the displacement $\Delta$ in the vertical direction (the thickness direction of the piezoelectric film 3) at the other end (open end) of the cantilever is measured using a laser Doppler displacement meter 21 (FIG. 4(b)).

The piezoelectric constant $d_{31}$ is calculated from the displacement $\Delta$, the cantilever length, the thicknesses and Young's moduli of the substrate 1 and piezoelectric thin film 3 and the applied electric field (=[applied voltage]/[film thickness]). For details on the $d_{31}$ calculation formula, see reference: I. Kanno, H. Kotera, and K. Wasa: Measurement of transverse piezoelectric properties of PZT thin films, Sens. Actuators A 107 (2003) 68.

EXAMPLES

Examples of the present invention will be described below, however the present invention is not limited by these examples.

Figure 5:
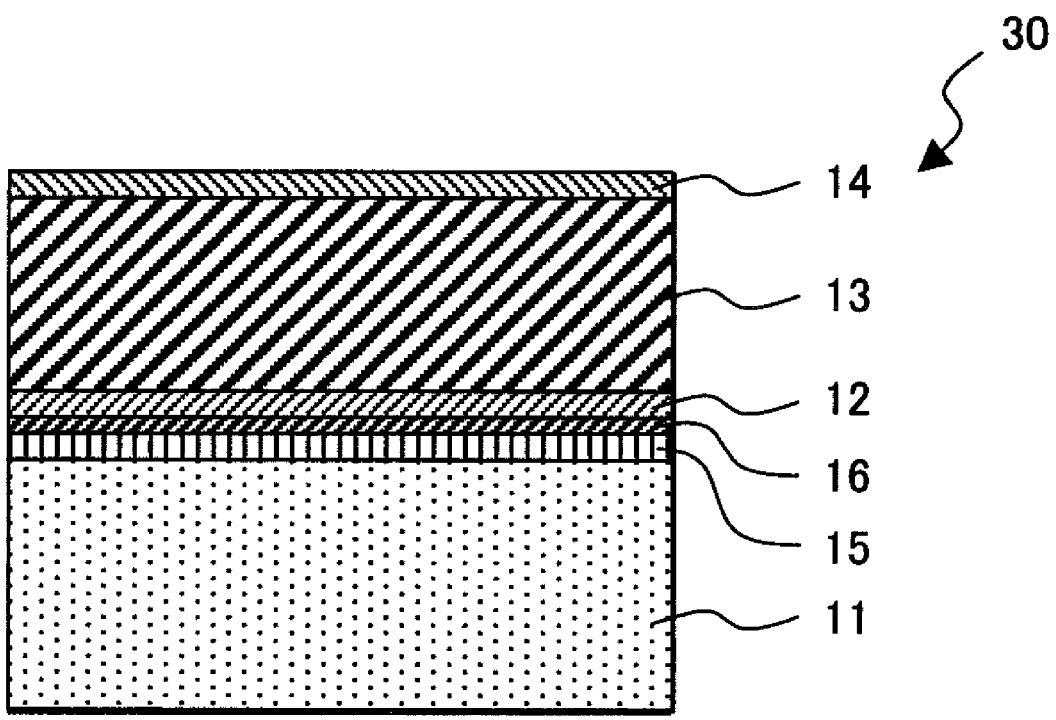
FIG. 5 is a schematic illustration showing a cross sectional view of the piezoelectric thin film device of Examples and Comparative examples.

FIG. 5 is a schematic illustration showing a cross sectional view of the piezoelectric thin film device of Examples and Comparative examples. The piezoelectric thin film devices 30 of Examples and Comparative examples were made by sequentially forming, on an Si substrate 11 (having an $SiO_2$ film 15 on its surface), a Ti adhesive layer 16, a Pt lower electrode 12, a $(K_{0.5}Na_{0.5})NbO_3$ piezoelectric thin film 13, and a Pt upper electrode 14.

Next, the fabrication method of the piezoelectric thin film device of Examples 1 to 8 and Comparative examples 1 to 19 will be detailed.

As the Si substrate 11, there was used an Si substrate with a thermal oxide layer (an $SiO_2$ film 15) on the substrate surface ($(100)_{Si}$ single crystalline substrate of 4-inch round wafer, substrate thickness of 0.5 mm, $SiO_2$ layer thickness of 0.5 μm). Firstly, on the Si substrate 11 was sequentially formed the Ti adhesive layer 16 (thickness of 1 to 10 nm) and the Pt lower electrode 12 (exclusively $(111)_{Pt}$ oriented, thickness of 0.2 μm) by RF magnetron sputtering.

The condition of formation of the Ti adhesive layer 16 and Pt lower electrode 12 was as follows: substrate temperature of 290 to 410° C.; discharge power of 200 W; introduced gas of $Ar/O_2$ ($Ar/O_2$=95/5 to 100/0); pressure of 2.5 Pa; and formation time of 1 to 10 min (for the Ti adhesive layer 16) and of 10 min (for the Pt lower electrode 12).

Subsequently, on the Pt lower electrode 12 was formed a 3-μm-thick $(K_{1-x}Na_x)NbO_3$ ($0.1 \leq x \leq 0.9$) piezoelectric thin film 13 by RF magnetron sputtering. The condition of formation of the $(K_{1-x}Na_x)NbO_3$ piezoelectric thin film 13 was as follows: sputtering target of the $(K_{1-x}Na_x)NbO_3$ sintered; substrate temperature of 500 to 600° C.; discharge power of 100 W; introduced gas of Ar; pressure of 0.4 Pa; and film formation time of 4 h.

On the $(K_{1-x}Na_x)NbO_3$ piezoelectric thin film 13 was further formed a 0.02-μm-thick Pt upper electrode 14 by RF magnetron sputtering. The condition of formation of the Pt upper electrode 14 was as follows: without substrate heating; discharge power of 200 W; introduced gas of Ar; pressure of 2.5 Pa; and film formation time of 1 min.

The piezoelectric thin film devices of the above mentioned Examples and Comparative examples were measured for the piezoelectric constant $d_{31}$. The measurement was executed according to the method described above in FIG. 4. For use in the cantilever, a 20-mm-long and 2.5-mm-wide rectangular strip of the piezoelectric thin film device was fabricated. The piezoelectric constant $d_{31}$ was calculated using a Young's modulus of 104 GPa for the KNN piezoelectric thin film 13.

Further, in order to evaluate a state of the crystal grain alignment and mixed crystal ratio of the KNN piezoelectric thin films 13, an X-ray diffraction 2θ/θ measurement was performed to the surface of the piezoelectric thin film devices 30 (of the Examples and Comparative examples) whose Pt upper electrode 14 had not been formed and whose KNN thin film 13 was therefore exposed. As an example, FIGS. 2 and 3 show XRD patterns measured for Comparative example 5 and Example 2 respectively. Comparing FIG. 2 with FIG. 3, it can be seen that the KNN thin film 13 of Example 2 in FIG. 3 exhibits a considerably stronger $(001)_{KNN}$ orientation than the KNN thin film 13 of Comparative Example 5 in FIG. 2.

As has been already described, the occupation ratio of the $(001)_{KNN}$ plane of the KNN thin film 15 is determined using KNN diffraction peaks positioned at an angle 2θ between 20° and 38° in an XRD 2θ/θ measurement and calculated from the expression: [($(001)_{KNN}$ diffraction peak intensity)/(sum of all KNN diffraction peak intensities)]×100(%). Specifically, as the $(001)_{KNN}$ diffraction peak, there was chosen a diffraction peak positioned at a diffraction angle 2θ between 22.011° and 22.890°. And, in calculating the sum of all KNN peak intensities positioned at an angle 2θ between 20° and 38°, there were taken into account "$(001)_{KNN}$ plane diffraction peak", and "$(110)_{KNN}$ plane diffraction peak" and "diffraction peaks (positioned at an angle 2θ near 29° and)34° attributable to KNN which did not assume a perovskite structure but a different crystal structure".

FIGS. 6A to 6C are tables showing, for Examples 1 to 8 and Comparative examples 1 to 19: forming condition of Pt/Ti film [(Pt lower electrode 14)/(Ti adhesive layer 13)]; forming condition of the KNN film (KNN thin film 15); occupation ratio of $(001)_{KNN}$ plane (%); $(001)_{KNN}$ plane diffraction peak angles (deg.); and absolute value of the piezoelectric constants $d_{31}$ (pm/V) under an electric field of 30 kV/cm. In FIGS. 6A, 6B and 6C, the forming temperatures of the KNN thin film 15 are 500, 550 and 600° C. respectively. And in each of FIGS. 6A, 6B and 6C, the composition Na/(K+Na) is varied from 0.1 to 0.9.

It can be recognized that the $(001)_{KNN}$ plane diffraction peak angle 2θ of the KNN films increases with increasing the composition Na/(K+Na). It can also be revealed that the occupation ratio of $(001)_{KNN}$ plane of the KNN films tends to increase with decreasing the thickness of the Ti adhesive layer (e.g., within a range of 1 to 5 nm), increasing the forming temperature of the Pt thin film (e.g., within a range of 330 to 410° C.), or decreasing the $O_2$ partial pressure in the Pt film sputtering ambient (e.g., 5% or less), although also depending on other factors such as the KNN thin film forming condition. Especially, the KNN films of Examples 1, 3, 5, 6 and 8 achieved the occupation ratio of $(001)_{KNN}$ plane of 90% or more by, when forming the Pt/Ti films, forming the Ti adhesive layer with a thickness of 3 nm or less, controlling the forming temperature of the Pt thin film within a range of 380 to 410° C. and decreasing the $O_2$ partial pressure of 2% or less in the Pt film sputtering ambient.

As shown in FIGS. 6A to 6C, a $|d_{31}|$ value of as high as 81 to 88 pm/V could be obtained for Examples 1 to 8, which satisfied both the condition that the KNN film had the occupation ratio of $(001)_{KNN}$ plane of 80% or more and the condition that the $(001)_{KNN}$ plane diffraction peak angle 2θ fell within a range from 22.1° to 22.5°. By contrast, Comparative examples 1 to 18, which did not satisfy both of the above two conditions, exhibited a $|d_{31}|$ value of only 58 pm/V or less. Thus, in Examples 1 to 8 that satisfied both of the above two conditions, the $|d_{31}|$ value was greatly improved and satisfied the relationship $|d_{31}| \geq 80$ pm/V which is a requirement of a piezoelectric thin film for use in gyro sensors.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A sensor for detecting a physical quantity, comprising:
   a piezoelectric thin film device including a lower electrode, a piezoelectric thin film and an upper electrode; and
   a voltage detecting device connected between the lower and upper electrodes of the piezoelectric thin film device;
   wherein the piezoelectric thin film is formed of an alkali niobium oxide-based perovskite material expressed by $(K_{1-x}Na_x)NbO_3$ (0<x<1); and
   wherein a $(001)_{KNN}$ plane diffraction peak of the piezoelectric thin film indicates an angle 2θ from 22.1° to 22.5° in an X-ray diffraction 2θ/θ measurement to a surface of the piezoelectric thin film, and the $(001)_{KNN}$ plane diffraction peak occupies 80% or more of diffraction peaks of the piezoelectric thin film.

2. The sensor according to claim 1, wherein an absolute value of the piezoelectric constant $|d_{31}|$ of the piezoelectric thin film is 80 pm/V or more under an applied electric field of 30 kV/cm.

3. The sensor according to claim 1, wherein the lower electrode is formed of a platinum thin film.

4. The sensor according to claim 1, wherein the lower electrode is formed of a highly preferentially $(111)_{Pt}$ plane oriented platinum thin film.

5. The sensor according to claim 1, wherein the piezoelectric thin film device further includes a substrate and an adhesive layer, and wherein the adhesive layer is disposed between the substrate and the lower electrode.

6. The sensor according to claim 1, wherein the piezoelectric thin film device further includes a substrate and an adhesive layer, and wherein the adhesive layer is disposed between the substrate and the lower electrode, and is formed of a titanium thin film.

7. The sensor according to claim 1, wherein between the lower electrode and the piezoelectric thin film is interposed a thin film of a material selected from a group consisting of $LaNiO_3$, $NaNbO_3$ and $(K_{1-x}Na_x)NbO_3$ (0<x<1) having a composition ratio x greater than that of the piezoelectric thin film.

8. The sensor according to claim 1, wherein the sensor is any one of a gyro sensor, a supersonic sensor, a pressure sensor, and a velocity/acceleration sensor.

9. An actuator, comprising:
   a piezoelectric thin film device including a lower electrode, a piezoelectric thin film and an upper electrode; and
   a voltage applying device connected between the lower and upper electrodes of the piezoelectric thin film device;
   wherein the piezoelectric thin film is formed of an alkali niobium oxide-based perovskite material expressed by $(K_{1-x}Na_x)NbO_3$ (0<x<1); and
   wherein a $(001)_{KNN}$ plane diffraction peak of the piezoelectric thin film indicates an angle 2θ from 22.1° to 22.5° in an X-ray diffraction 2θ/θ measurement to a surface of the piezoelectric thin film, and the $(001)_{KNN}$ plane diffraction peak occupies 80% or more of diffraction peaks of the piezoelectric thin film.

10. The actuator according to claim 9, wherein an absolute value of the piezoelectric constant $|d_{31}|$ of the piezoelectric thin film is 80 pm/V or more under an applied electric field of 30 kV/cm.

11. The actuator according to claim 9, wherein the lower electrode is formed of a platinum thin film.

12. The actuator according to claim 9, wherein the lower electrode is formed of a highly preferentially (111)Pt plane oriented platinum thin film.

13. The actuator according to claim 9, wherein the piezoelectric thin film device further includes a substrate and an adhesive layer, and wherein the adhesive layer is disposed between the substrate and the lower electrode.

14. The actuator according to claim 9, wherein the piezoelectric thin film device further includes a substrate and an adhesive layer, and wherein the adhesive layer is disposed between the substrate and the lower electrode, and is formed of a titanium thin film.

15. The actuator according to claim 9, wherein between the lower electrode and the piezoelectric thin film is interposed a thin film of a material selected from a group consisting of $LaNiO_3$, $NaNbO_3$ and $(K_{1-x}Na_x)NbO_3$ ($0<x<1$) having a composition ratio x greater than that of the piezoelectric thin film.

16. The actuator according to claim 9, wherein the actuator is used for any one of an inkjet printer, a scanner, and a supersonic generator.

* * * * *